(12) United States Patent
Yeh et al.

(10) Patent No.: US 9,611,542 B2
(45) Date of Patent: Apr. 4, 2017

(54) FILM DEPOSITION SYSTEM HAVING A SUBSTRATE CARRIER AND A COOLING DEVICE

(71) Applicant: Linco Technology Co., Ltd., Taichung (TW)

(72) Inventors: Cheng-Peng Yeh, Changhua (TW);
Huei-Chia Su, Taichung (TW);
Chung-Yu Yeh, Taichung (TW);
Tsung-Wei Chang, Taichung (TW);
Yi-Yuan Huang, Taichung (TW);
Wan-Yu Huang, Keelung (TW);
Mu-Sen Lu, Taichung (TW)

(73) Assignee: Linco Technology Co., Ltd., Taichung (TW)

( * ) Notice: Subject to any disclaimer, the term of this patent is extended or adjusted under 35 U.S.C. 154(b) by 33 days.

(21) Appl. No.: 14/702,100

(22) Filed: May 1, 2015

(65) Prior Publication Data

US 2016/0318061 A1    Nov. 3, 2016

(51) Int. Cl.
*B05C 9/12*    (2006.01)
*C23C 14/54*    (2006.01)
(Continued)

(52) U.S. Cl.
CPC .............. *C23C 14/541* (2013.01); *B05C 9/14* (2013.01); *C23C 14/35* (2013.01);
(Continued)

(58) Field of Classification Search
CPC ..... H01L 23/427; H01L 23/34; H01L 23/373; H01L 23/38; H01L 23/4275; H01L 51/529; C23C 14/541; C23C 16/463
See application file for complete search history.

(56) References Cited

U.S. PATENT DOCUMENTS 4,322,737 A * 3/1982 Sliwa, Jr. .............. F28D 15/046
165/104.26
8,426,829 B2 * 4/2013 Leavitt ................... H01J 37/20
250/442.11

(Continued)

FOREIGN PATENT DOCUMENTS

| CN | 103898448 A | 7/2014 |
|---|---|---|
| TW | M240617 U | 8/2004 |
| TW | M258101 U | 3/2005 |

OTHER PUBLICATIONS

TW Search Report in corresponding TW application No. 2015100103958 dated Oct. 26, 2016 (7 pages).

*Primary Examiner* — Karl Kurple (74) *Attorney, Agent, or Firm* — Trop Pruner & Hu, P.C.

(57) ABSTRACT

A film deposition system includes a substrate carrier, a film deposition device, a transport device and a cooling device. The substrate carrier includes a carrier body that defines an isolated space therein, and a phase transition material that is filled into the isolated space and that has a melting point ranging between 18° C. and 95° C. The phase transition material is capable of absorbing thermal energy from the carrier body as latent heat to change the phase of the phase transition material from solid to liquid. The cooling device is configured to absorb thermal energy from the substrate carrier so as to change the phase of the phase transition material from liquid to solid.

7 Claims, 8 Drawing Sheets

(51) Int. Cl.
*C23C 16/458* (2006.01)
*H01L 23/427* (2006.01)
*B05C 9/14* (2006.01)
*C23C 14/35* (2006.01)
*B05C 11/10* (2006.01)

(52) U.S. Cl.
CPC ........ *C23C 16/4586* (2013.01); *H01L 23/427* (2013.01); *B05C 11/1021* (2013.01)

(56) References Cited

U.S. PATENT DOCUMENTS

| | | | | |
|---|---|---|---|---|
| 2002/0100581 | A1* | 8/2002 | Knowles | B82Y 10/00 165/185 |
| 2003/0068215 | A1* | 4/2003 | Mori | H01L 21/67742 414/217 |
| 2006/0289433 | A1* | 12/2006 | Timans | F27B 5/04 219/390 |
| 2008/0014482 | A1* | 1/2008 | Yamamiya | H01M 8/04007 429/421 |
| 2012/0273920 | A1* | 11/2012 | Fedorov | H01L 23/373 257/532 |
| 2012/0295028 | A1* | 11/2012 | Zenitani | C23C 14/086 427/255.5 |
| 2013/0056187 | A1* | 3/2013 | Kayamoto | C23C 24/04 165/168 |
| 2014/0238637 | A1* | 8/2014 | Tanaka | F25B 21/02 165/47 |

* cited by examiner

FILM DEPOSITION SYSTEM HAVING A SUBSTRATE CARRIER AND A COOLING DEVICE

FIELD

The disclosure relates to a film deposition system, more particularly to a film deposition system having a substrate carrier and a cooling device.

BACKGROUND

Recently, vacuum sputtering coating technology using different types of vacuum sputtering apparatuses has been widely adopted in the industry, e.g., for forming an electromagnetic interference (EMI) shielding film on a portable electronic device or for forming an optical film on an optical lens. Among the different types of vacuum sputtering apparatuses, an in-line multi-chamber sputtering apparatus is most widely used due to its various advantages, such as high yield, fast speed, good coating quality, lower manufacturing costs, etc. In general, a conventional in-line multi-chamber sputtering apparatus includes at least three chambers: a feeding chamber, a deposition chamber and a discharge chamber. During the sputtering process, a substrate (on which the film is to be deposited) is firstly disposed on a substrate carrier. The substrate carrier along with the substrate is disposed on a transport unit which is able to transport the substrate carrier along with the substrate into each of the chambers or among the chambers. The substrate is deposited with a film in the deposition chamber and is then discharged from the discharge chamber to obtain a deposited substrate (as a product).

Figure 1:
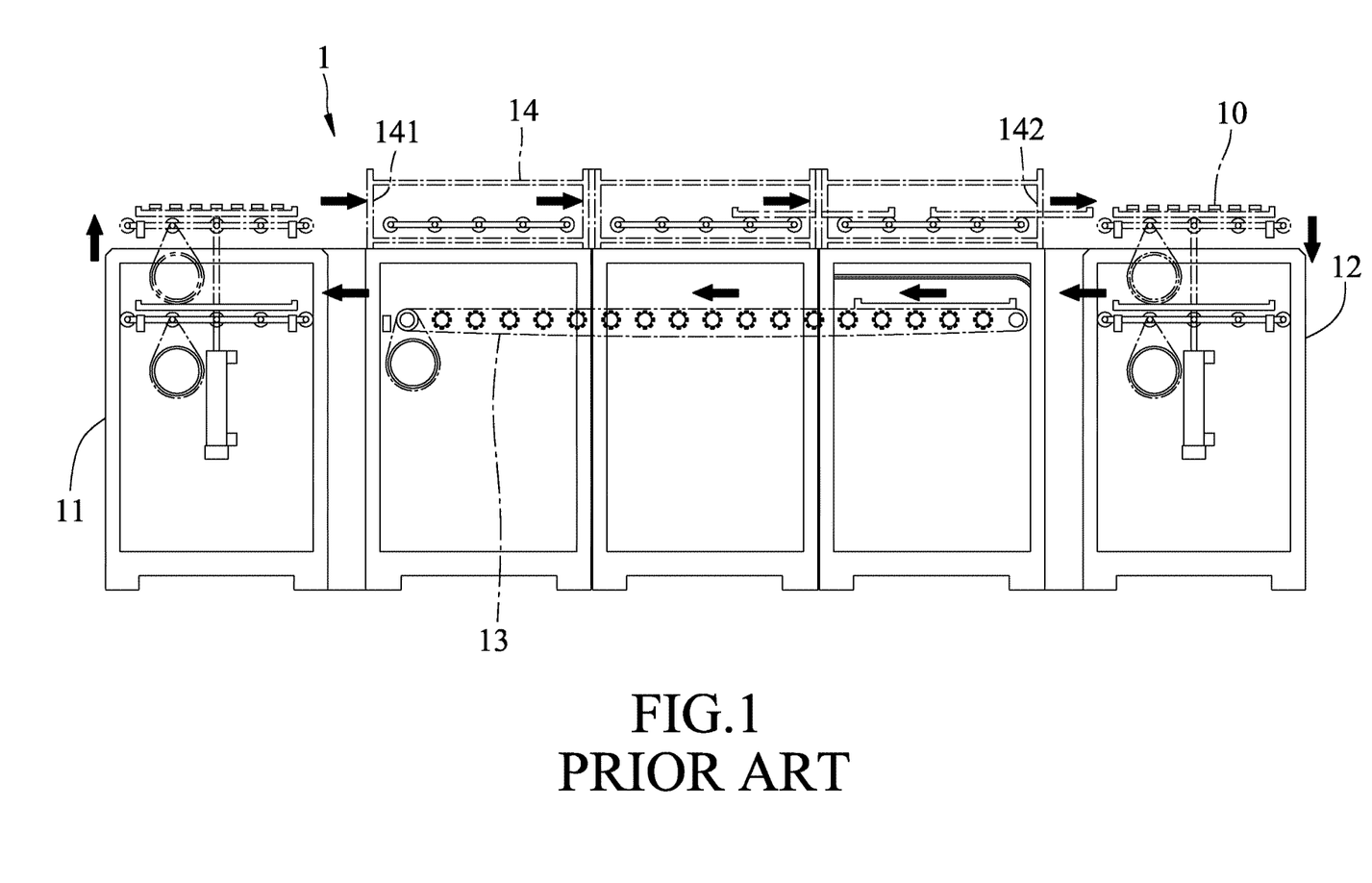
FIG. 1 is a schematic view showing a conventional film deposition system.

FIG. 1 discloses a conventional film deposition system 1 that includes a substrate carrier 10, a multi-chamber film deposition station 14, a transport device 13 disposed under the multi-chamber film deposition station 14, a first elevating device 11 and a second elevating device 12. The multi-chamber film deposition station 14 includes an input end 141 and an output end 142 opposite to the input end 141. The first elevating device 11 is disposed adjacent to the input end 141 of the multi-chamber film deposition station 14. The second elevating device 12 is disposed adjacent to the output end 142 of the multi-chamber film deposition station 14. The first elevating device 11, the multi-chamber film deposition station 14, the second elevating device 12 and the transport device 13 cooperatively constitute a closed loop system.

The substrate carrier 10 firstly carries a substrate (on which the film is to be deposited) into the multi-chamber film deposition station 14 through the input end 141. Then, the substrate is deposited with a film in the multi-chamber film deposition chamber and is then discharged from the output end 142 to obtain a deposited substrate. The substrate carrier 10 along with the deposited substrate is then moved to a position above the second elevating device 12. On the second elevating device 12, the deposited substrate is removed from the substrate carrier 10 and lowered to the transport device 13 using a pressure cylinder. The substrate carrier 10 is then moved by the transport device 13 to the first elevating device 11, and is moved upwardly to the input end 141 of the multi-chamber film deposition station 14 using a pressure cylinder to carry a new substrate.

However, during the sputtering process, collisions between energetic ions and a target inside the multi-chamber film deposition station 14 generates a large amount of heat, causing the temperature inside the multi-chamber film deposition station 14 to be relatively high. The heat within the closed loop system may also raise the temperature of the substrate carrier 10 and the substrate transported through the multi-chamber film deposition station 14, thereby adversely affecting the quality of the deposited film.

SUMMARY

Therefore, an object of the disclosure is to provide a film deposition system that can alleviate at least one of the drawbacks of the prior art.

According to the disclosure, the film deposition system includes a substrate carrier, a film deposition device, a transport device and a cooling device. The substrate carrier includes a carrier body that defines an isolated space therein, and a phase transition material that is filled into the isolated space and that has a melting point ranging between 18° C. and 95° C. The phase transition material is capable of absorbing thermal energy from the carrier body as latent heat to change the phase of the phase transition material from solid to liquid. The film deposition device includes an input end and an output end. The substrate carrier enters into the film deposition device through the input end, and is moved out of the film deposition device through the output end. The transport device includes a transport unit that is disposed outside the film deposition device and that is capable of moving the substrate carrier along a transport path from the output end of the film deposition device to the input end of the film deposition device. The cooling device is configured to absorb thermal energy from the substrate carrier on the transport path so as to change the phase of the phase transition material from liquid to solid.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 2:
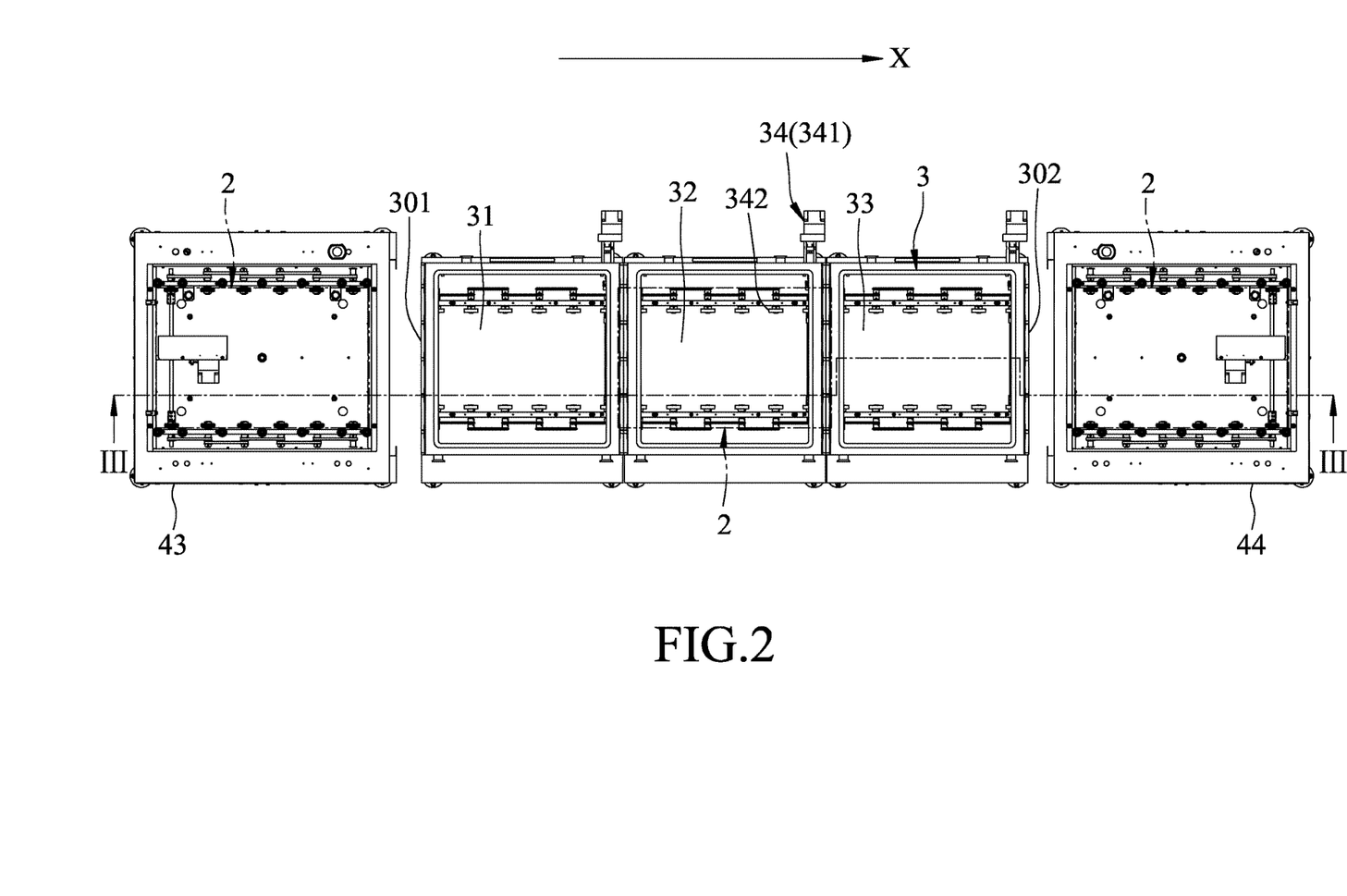
FIG. 2 is a schematic top view of the embodiment of a film deposition system according to the disclosure.
Figure 3:
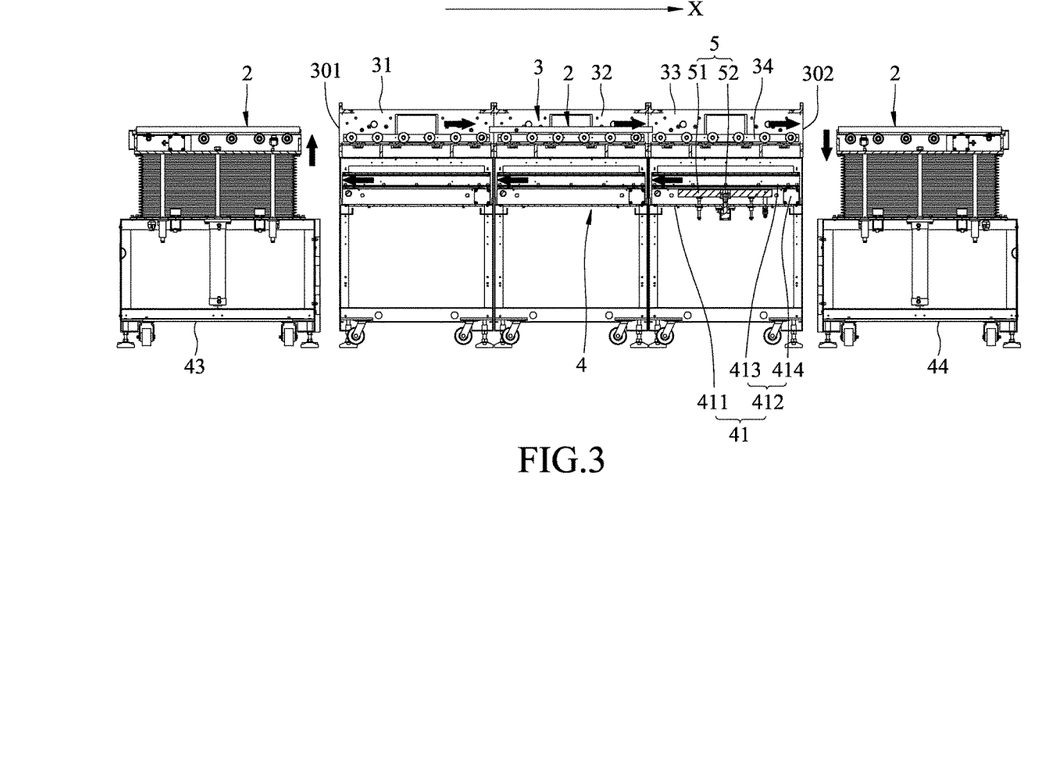
FIG. 3 is a sectional view of the embodiment taken along line in FIG. 2.
Figure 4:
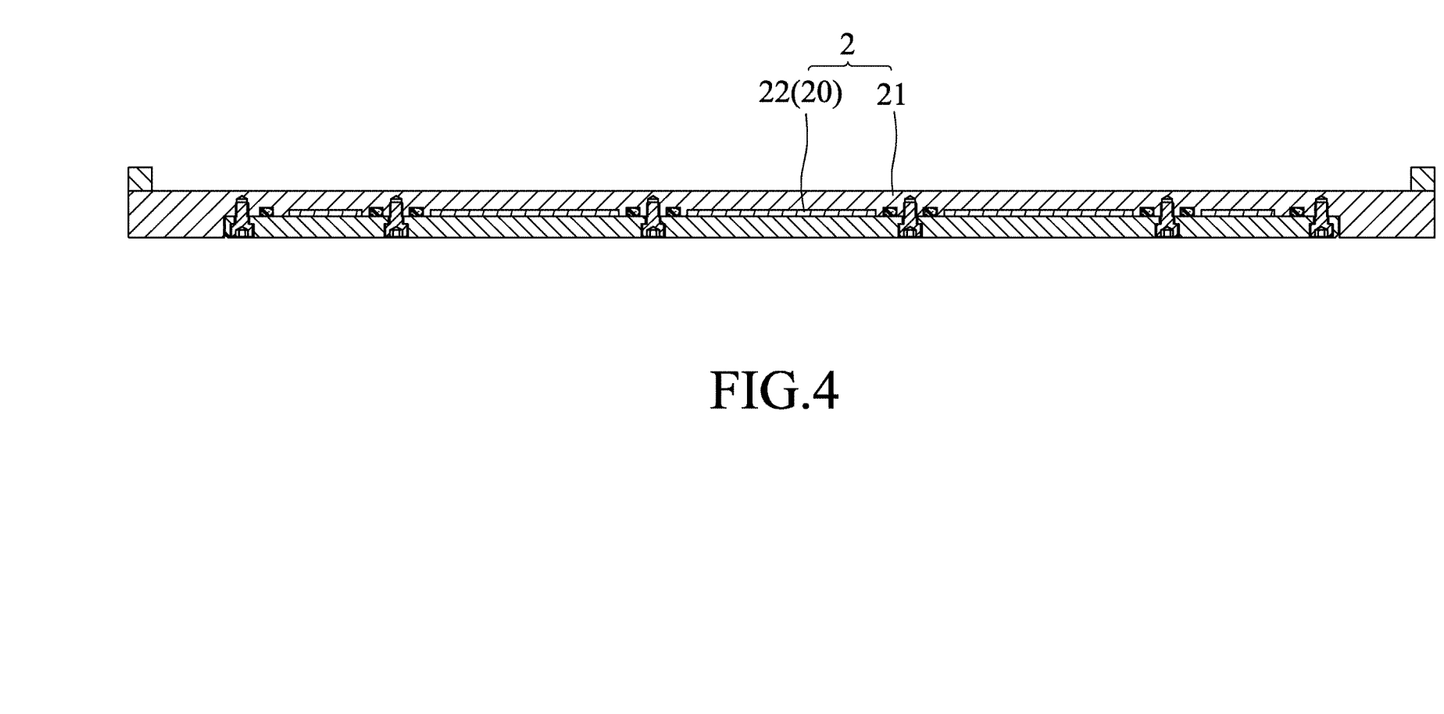
FIG. 4 is a cross-sectional view showing a substrate carrier of the embodiment.

Referring to FIGS. 2 to 4, the embodiment of a film deposition system according to this disclosure includes a substrate carrier 2 (see FIG. 4), a film deposition device 3, a transport device 4 and a cooling device 5.

As shown in FIG. 4, the substrate carrier 2 is used for carrying a substrate (on which the film is to be deposited) (not shown), and includes a carrier body 21 that defines an isolated space 20 therein, and a phase transition material 22 that is filled into the isolated space 20 and that has a melting point ranging between 18° C. and 95° C. In this embodiment, the carrier body 21 is made of an aluminum alloy.

The film deposition device 3 includes an input end 301 and an output end 302. The substrate carrier 2 along with the substrate enters into the film deposition device 3 through the input end 301, and is moved out of the film deposition device 3 through the output end 302. To be more specific, in this embodiment, the film deposition device 3 has a feeding chamber 31 that includes the input end 301, a film deposition chamber 32, and a discharge chamber 33 that includes the output end 302. The feeding chamber 31, the film deposition chamber 32 and the discharge chamber 33 are disposed in sequence along a direction (X). The film deposition process takes place in the film deposition chamber 32.

As shown in FIG. 2, the film deposition device 3 further includes a transport mechanism 34 which has a servomotor 341 and a plurality of rollers 342 and which transports the substrate carrier 2 in the film deposition device 3 along the direction (X). Since the configuration of the transport mechanism 34 is not the feature of this disclosure, a detailed description thereof is omitted herein for the sake of brevity.

Plasma generated in the film deposition process (e.g., a sputtering process) causes a large amount of thermal energy to accumulate on the substrate and the substrate carrier 2. The phase transition material 22 is capable of absorbing thermal energy from the carrier body 21 of the substrate carrier 2 as latent heat to change the phase of the phase transition material 22 from solid to liquid so as to cool the substrate. It should be noted that, when the phase transition material 22 absorbs thermal energy from the carrier body 21 and at least apart of the phase transition material 22 changes phase from solid to liquid, the total volume of the phase transition material 22 increases. In order to avoid damage or deformation of the substrate carrier 2 caused by the increased volume of the phase transition material 22, a volume of the isolated space 20 is equal to or greater than a volume of the phase transition material 22 in liquid phase. During the heat absorbing process, the phase transition material 22 has a heat storage capacity ranging from 134 (kJ/kg) to 250 (kJ/kg) and undergoes a phase transition from solid to liquid. The phase transition material 22 is one of an organic material and an inorganic material.

To be more specific, in this embodiment, the organic material is a hydrocarbon. In some examples of the embodiment, the organic material may be an alkane. In certain examples of the embodiment, the organic material may be a $C_{16}$ to $C_{50}$ alkane, e.g., a wax of $C_{30}$ to $C_{50}$ alkane. In general, the phase transition material 22 (i.e., the above-mentioned $C_{16}$ to $C_{50}$ alkane) in solid phase occupies 80% to 90% of a volume of the isolated space 20. It should be noted that when the aforesaid phase transition material 3 in solid phase melts into the liquid phase, the volume of the phase transition material 3 in liquid phase will not be greater than the volume of the isolated space 20.

The inorganic material is one of a hydrated salt ($M_nH_2O$) and a molten salt. To be more specific, examples of the hydrated salt are sodium sulfate decahydrate ($Na_2SO_4.10H_2O$), sodium acetate trihydrate ($C_2H_3NaO_2.3H_2O$), and ammonium aluminium sulfate dodecahydrate ($NH_4Al(SO_4)_2.12H_2O$). Examples of the molten salt are sodium nitrate ($NaNO_3$) and potassium nitrate ($KNO_3$). In some embodiments of the disclosure, an additive is added to the hydrated salt to reduce the volume change of the hydrated salt when changing from solid phase to liquid phase.

Since the phase transition material 22 absorbs most thermal energy from the carrier body 21, the substrate carrier 2 would not need to be further cooled before the next film deposition process. However, the phase transition material 22 would need to be cooled to change phase from liquid to solid for further application in the next film deposition process.

Figure 5:
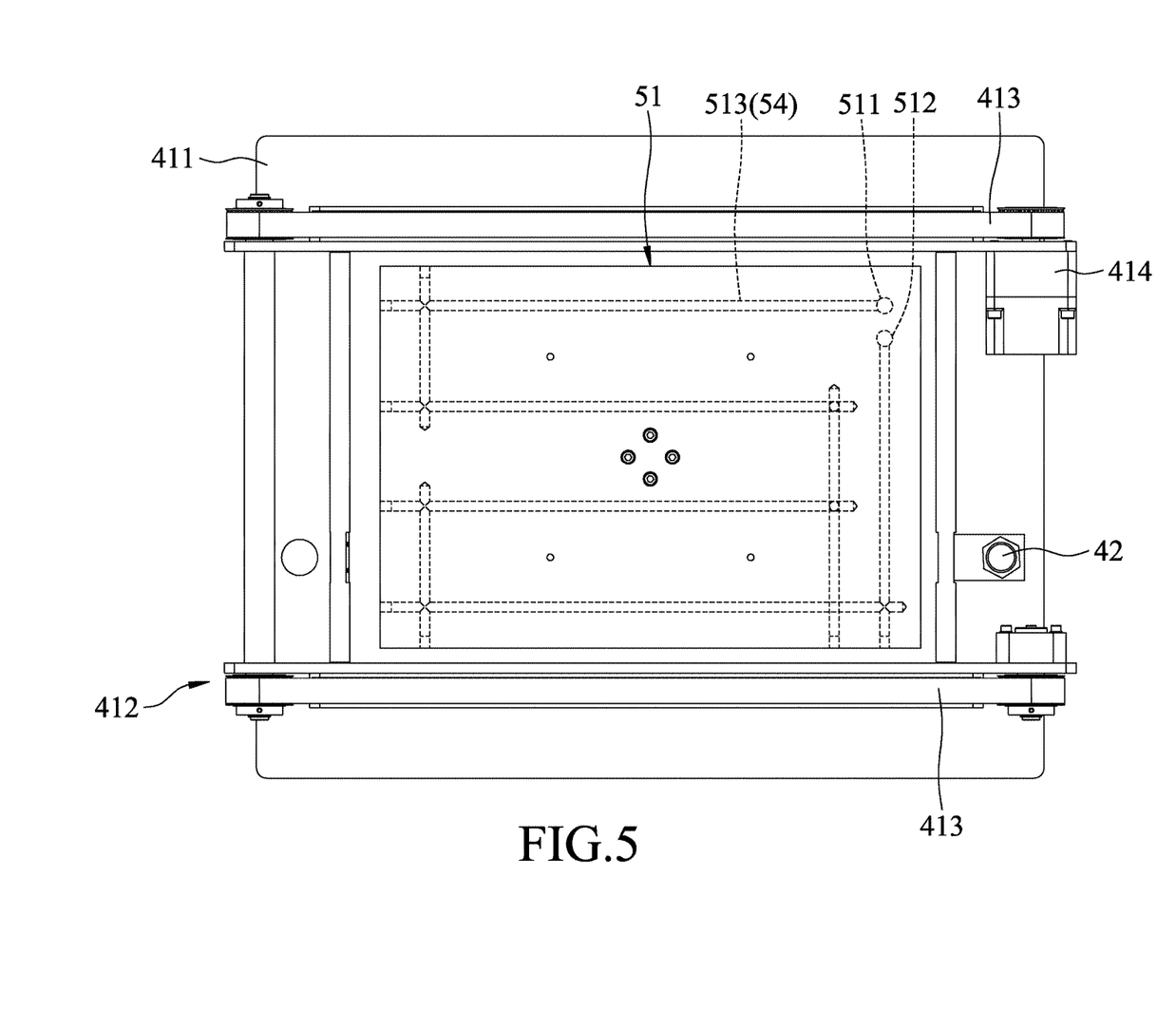
FIG. 5 is a schematic top view showing a transport device and a cooling device of the embodiment.
Figure 6:
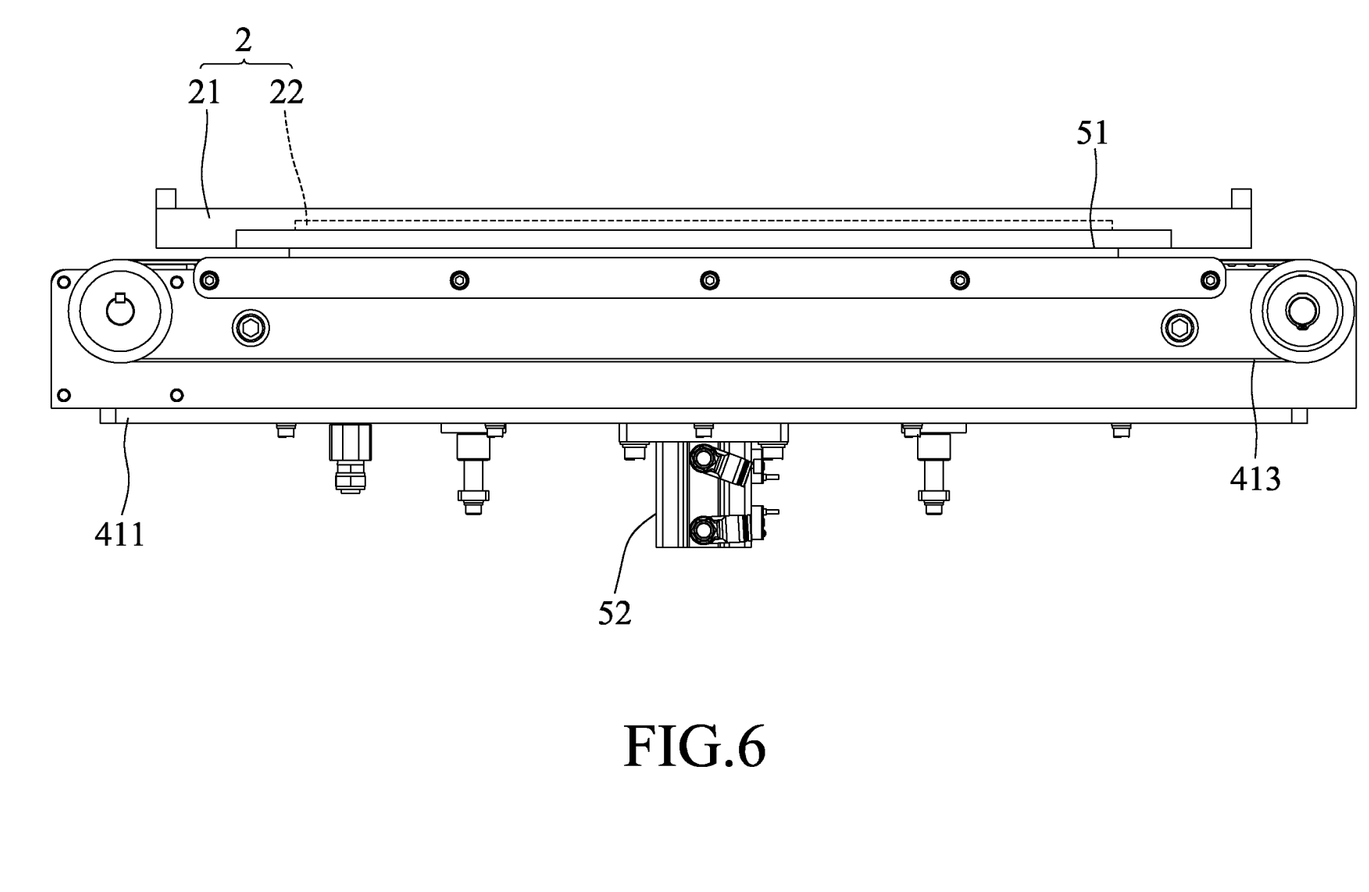
FIG. 6 is a schematic front view showing that the substrate carrier is in contact with the cooling device.

Referring to FIGS. 3, 5, and 6, the transport device 4 includes a transport unit 41, a sensing unit 42 (see FIG. 5), a first elevating unit 43 and a second elevating unit 44.

The transport unit 41 is disposed outside the film deposition device 3 and is capable of moving the substrate carrier 2 along a transport path from the output end 302 of the film deposition device 3 to the input end 301 of the film deposition device 3. The transport unit 41 has a bracket 411 and a transport member 412 mounted to the bracket 411. The transport member 412 has two transport modules 413 that are spaced-apart from each other and that are capable of moving the substrate carrier 2, and a servomotor 414 that drives movement of the transport modules 413. In this embodiment, each of the transport modules 413 is a circulating transport belt.

The sensing unit 42 is disposed on the bracket 411 of the transport unit 41. In this embodiment, the sensing unit 42 is a proximity switch that is operable for detecting the presence of the substrate carrier 2.

In this embodiment, the transport unit 41 of the transport device 4 is disposed under the film deposition device 3 (as best shown in FIG. 3). The first elevating unit 43 is disposed downstream of the transport unit 41 and adjacent to the input end 301 of the film deposition device 3 so as to transport the substrate carrier 2 from the transport unit 41 to the input end 301. The second elevating unit 44 is disposed upstream of the transport unit 41 and adjacent to the output end 302 of the film deposition device 3 so as to transport the substrate carrier 2 from the output end 302 to the transport unit 41. However, it should be clear to those skilled in the art that the location of the transport unit 41 in this embodiment may be varied and should not be limited by this disclosure.

Referring to FIGS. 3, 5 and 6, the cooling device 5 is configured to absorb thermal energy from the substrate carrier 2 on the transport path so as to change the phase of at least a part of the phase transition material 22 from liquid to solid. In this embodiment, the cooling device 5 is located at a bottom side of the film deposition device 3, is disposed on the bracket 411 of the transport unit 41, and has a thermal dissipating plate 51 and a driving member 52.

When the substrate carrier 2 is transported to a predetermined position on the transport path and is detected by the sensing unit 42, the sensing unit 42 generates a signal to stop the driving operation of the servomotor 414. The thermal dissipating plate 51 of the cooling device 5 is then moved to the predetermined position on the transport path so as to contact the substrate carrier 2 and absorb thermal energy from the substrate carrier 2 so as to cool the substrate carrier 2 and change the phase of at least a part of the phase transition material 22 from liquid to solid. When the thermal dissipating plate 51 is in contact with the substrate carrier 2, the thermal dissipating plate 51 is located between the transport modules 413. To be more specific, the driving member 52 drives the thermal dissipating plate 51 to move toward and away from the predetermined position on the transport path. In this embodiment, the thermal dissipating plate 51 has an entrance 511, an exit 512 and a cooling passage 513 that extends from the entrance 511 to the exit 512 and that allows a cooling liquid to flow therethrough. During operation, in this embodiment, the thermal dissipating plate 51 is moved upwardly to contact and cool the substrate carrier 2. After the substrate carrier 2 is cooled, the driving member 52 drives the thermal dissipating plate 51 to move downwardly and away from the substrate carrier 2, the transport modules 413 are then driven by the servomotor 414 to move the substrate carrier 2 to the first elevating unit 43. On the first elevating unit 43, another substrate (on which film is to be deposited) is disposed on the substrate carrier 2 and is moved to the film deposition device 3 to repeat the film deposition process.

Figure 7:
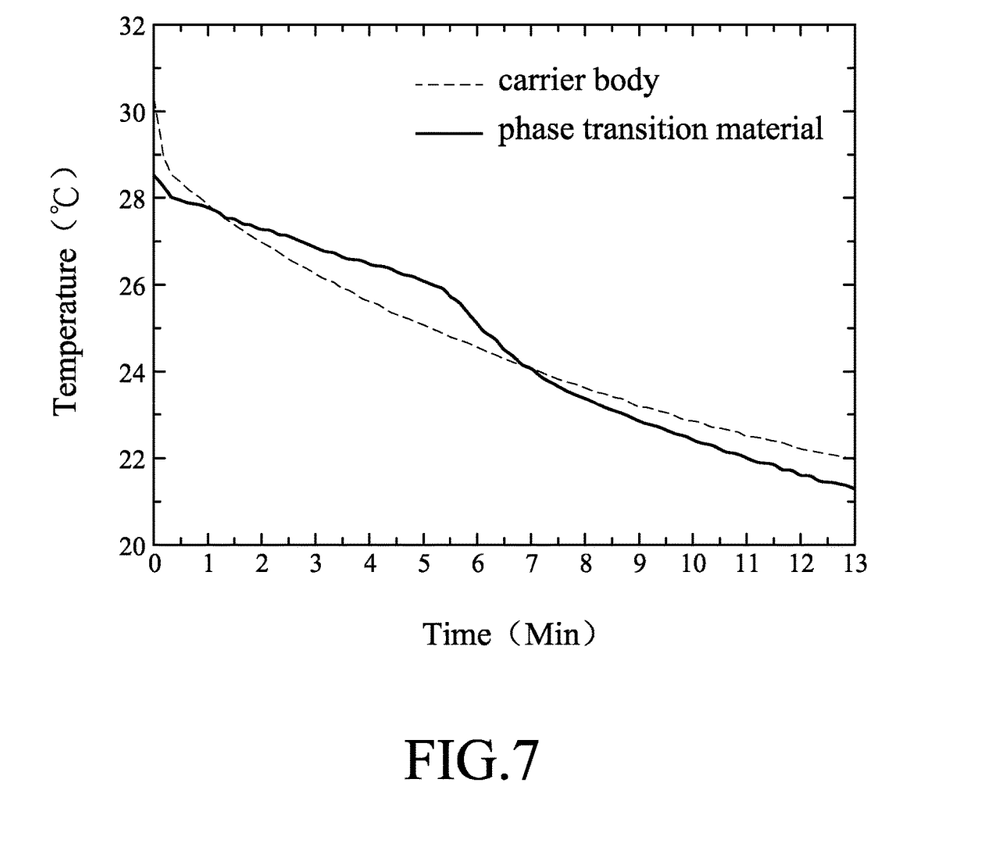
FIG. 7 is a simulation diagram of temperature versus time, showing temperature changes of a carrier body and a phase transition material during a cooling process.
Figure 8:
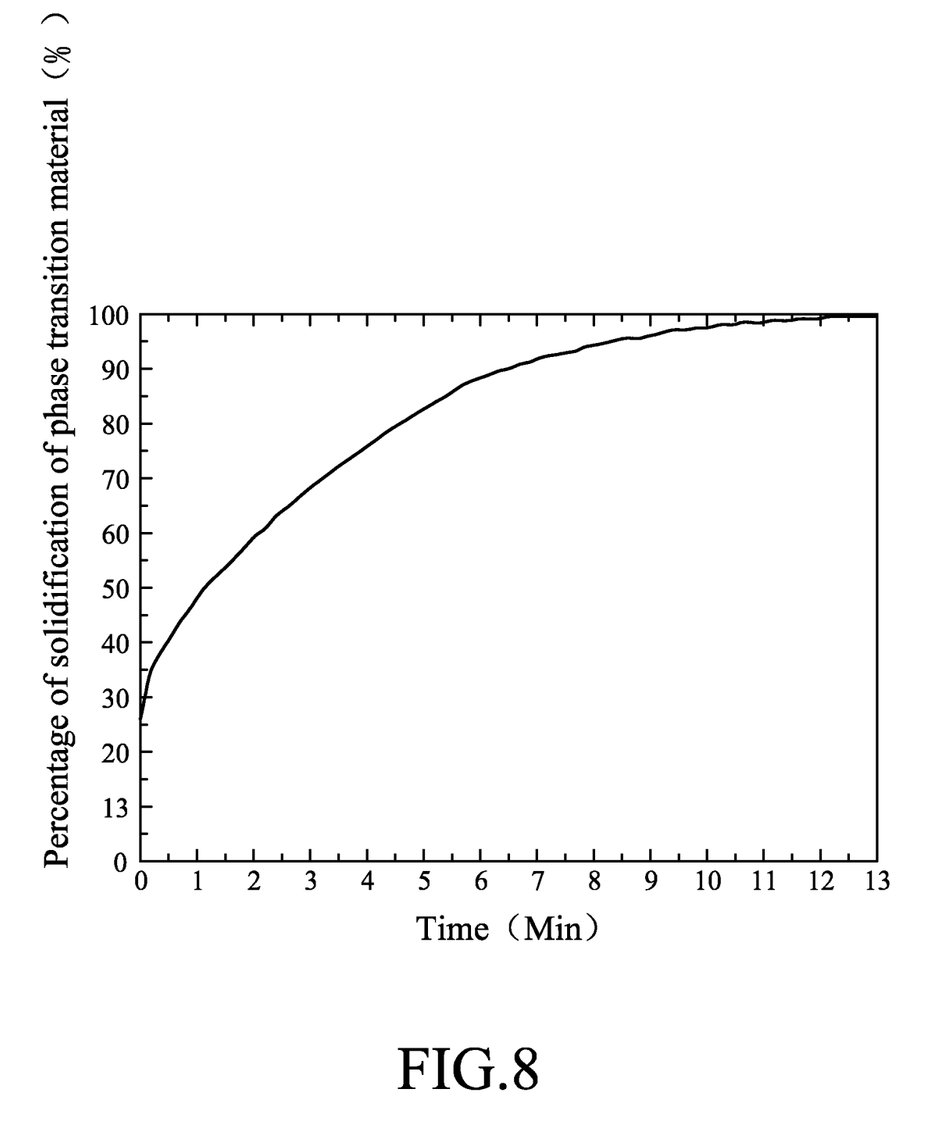
FIG. 8 is a simulation diagram of percentage of solidification versus time, showing a percentage of the phase transition material in solid phase during the cooling process.

FIG. 7 is a simulation diagram of temperature (° C.) versus time (min), showing temperature changes of the carrier body 21 and the phase transition material 22 during the cooling process. FIG. 8 is a simulation diagram of percentage of solidification (%) versus time (min), showing the percentages of the phase transition material 22 in solid phase during the cooling process. The time in FIGS. 7 and 8 indicates the duration that the substrate carrier 2 contacts the thermal dissipating plate 51. In this simulation, the phase transition material 22 is octadecane ($C_{18}H_{38}$). As shown in FIG. 7, the temperature of the carrier body 21 and the phase transition material 22 gradually decreases during the cooling process. As shown in FIG. 8, the percentage of solidification of the phase transition material 22 gradually increases with time, and reaches 100 percent after 13 minutes of cooling, which indicates that the cooling device 5 of this disclosure could effectively cool the substrate carrier 2.

In a variation of this embodiment, the thermal dissipating plate 51 and the driving member 52 of the cooling device 5 may be replaced by a fan (not shown in Figures).

It should be noted that, the film deposition system of this disclosure may be in a batch type, an in-line type, a cluster type, a roll-to-roll type, etc. The input end 301 and the output end 302 may be located at different positions or the same position. The film deposition system in FIGS. 2 and 3, which illustrate an in-line film deposition system that has the input end 301 and the output end 302 separated from each other, is just an example and should not be taken as a limitation of this disclosure.

It should be noted that, plasma generated in the sputtering process causes a large amount of thermal energy to accumulate on the substrate. In this disclosure, the thermal energy on the substrate is conducted through the carrier body 21 to the phase transition material 22 so that the phase transition material 22 absorbs the thermal energy as latent heat to change phase from solid to liquid. As a result, the phase transition material 22 would significantly improve thermal dissipation efficiency, thereby improving the quality of the product. Moreover, by virtue of the cooling device 5 to cool the phase transition material 22, the substrate carrier 2 can be reused in the next sputtering process.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A film deposition system, comprising:
    a substrate carrier including a carrier body that defines an isolated space therein, and a phase transition material that is filled into said isolated space and said phase transition material has a melting point ranging between 18° C. and 95° C., said phase transition material being capable of absorbing thermal energy from said carrier body as latent heat to change the phase of said phase transition material from solid to liquid;
    a film deposition device including an input end and an output end, said substrate carrier entering into said film deposition device through said input end, and being moved out of said film deposition device through said output end;
    a transport device including a transport unit that is disposed outside said film deposition device and that is capable of moving said substrate carrier along a transport path from said output end of said film deposition device to said input end of said film deposition device; and a cooling device configured to absorb thermal energy from said substrate carrier on said transport path so as to change the phase of said phase transition material from liquid to solid,
    wherein said transport unit has a bracket and a transport member mounted to said bracket, said transport member having two transport modules that are spaced-apart from each other and that are capable of moving said substrate carrier, and a servomotor that drives movement of said transport modules, and
    wherein said transport device further includes a sensing unit disposed on said bracket of said transport unit, when said substrate carrier being transported to a predetermined position on said transport path and being detected by said sensing unit, said sensing unit generates a signal to stop said servomotor, said cooling device then being moved to said predetermined position on said transport path so as to contact and absorb thermal energy from said substrate carrier.

2. The film deposition system as claimed in claim 1, wherein said phase transition material is one of an organic material and an inorganic material, said organic material being a $C_{16}$ to $C_{50}$ alkane.

3. The film deposition system as claimed in claim 1, wherein a volume of said isolated space is equal to or greater than a volume of said phase transition material in liquid phase.

4. The film deposition system as claimed in claim 1, wherein each of said transport modules is a circulating transport belt.

5. The film deposition system as claimed in claim 1, wherein said cooling device is disposed on said bracket of said transport unit and has a thermal dissipating plate and a driving member that drives said thermal dissipating plate to move toward and away from said predetermined position on said transport path, said thermal dissipating plate having an entrance, an exit and a cooling passage that extends from said entrance to said exit and that allows a cooling liquid to flow therethrough, when said thermal dissipating plate being in contact with said substrate carrier, said thermal dissipating plate is located between said transport modules.

6. The film deposition system as claimed in claim 1, wherein said cooling device is disposed at a bottom side of said film deposition device.

7. The film deposition system as claimed in claim 6, wherein said transport device further includes a first elevating unit and a second elevating unit, said first elevating unit being disposed downstream of said transport unit and adjacent to said input end of said film deposition device so as to transport said substrate carrier from said transport unit to said input end, said second elevating unit being disposed upstream of said transport unit and adjacent to said output end of said film deposition device so as to transport said substrate carrier from said output end to said transport unit.

\* \* \* \* \*